(12) United States Patent
Jia et al.

(10) Patent No.: US 10,454,625 B2
(45) Date of Patent: Oct. 22, 2019

(54) SYSTEM AND METHOD FOR EMPLOYING OUTER CODES WITH NON-EQUAL LENGTH CODEBLOCKS FIELD

(71) Applicants: Ming Jia, Ottawa (CA); Jianglei Ma, Ottawa (CA)

(72) Inventors: Ming Jia, Ottawa (CA); Jianglei Ma, Ottawa (CA)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 96 days.

(21) Appl. No.: 15/873,478

(22) Filed: Jan. 17, 2018

(65) Prior Publication Data

US 2018/0262303 A1    Sep. 13, 2018

Related U.S. Application Data

(60) Provisional application No. 62/469,687, filed on Mar. 10, 2017.

(51) Int. Cl.
*H04L 1/18* (2006.01)
*H03M 13/00* (2006.01)
(Continued)

(52) U.S. Cl.
CPC ...... *H04L 1/1812* (2013.01); *H03M 13/2906* (2013.01); *H03M 13/6306* (2013.01);
(Continued)

(58) Field of Classification Search
CPC ... H04L 1/1812; H04L 1/0041; H04L 1/0045; H04L 1/0058; H04L 1/0064;
(Continued)

(56) References Cited

U.S. PATENT DOCUMENTS

2009/0323577 A1* 12/2009 Agrawal ............... H04L 1/0026
370/312
2010/0157918 A1 6/2010 Kim et al.
(Continued)

FOREIGN PATENT DOCUMENTS

CN    105794165 A    7/2016
WO    2009021375 A1   2/2009

OTHER PUBLICATIONS

Qualcomm Incorporated, "Erasure coding and HARQ design", 3GPP TSG-RAN WG1 #86bis, R1-1610143, Agenda Item 8.1.3.1, Oct. 10-14, 2016, Lisbon, Portugal, pp. 1-7.
(Continued)

*Primary Examiner* — Christine T. Tu

(57) ABSTRACT

Methods are disclosed herein for generating and using outer codes based on non-equal length code blocks. In one embodiment, the outer code has a length equal to the length of the longest code block. This can be achieved by padding shorter code blocks such that they are also of equal length to the longest code block. The padding may be a standardized pseudo-random pattern or a standardized repeating pattern. In another embodiment, the outer code has a length shorter than the length of the longest code block. If a code block is received in error it may be recovered by using one or more of: the first outer code block, information bits of other code blocks and the parity bits of the failed code block.

26 Claims, 10 Drawing Sheets

(51) Int. Cl.
*H04L 1/00* (2006.01)
*H03M 13/29* (2006.01)
*H03M 13/11* (2006.01)
*H03M 13/15* (2006.01)

(52) U.S. Cl.
CPC ...... *H03M 13/6513* (2013.01); *H04L 1/0041* (2013.01); *H04L 1/0045* (2013.01); *H04L 1/0058* (2013.01); *H04L 1/0064* (2013.01); *H03M 13/1102* (2013.01); *H03M 13/1105* (2013.01); *H03M 13/1515* (2013.01); *H04L 1/0008* (2013.01); *H04L 1/1829* (2013.01)

(58) Field of Classification Search
CPC ............... H04L 1/0008; H04L 1/1829; H03M 13/2906; H03M 13/6306; H03M 13/6513; H03M 13/1102; H03M 13/1105; H03M 13/1515
See application file for complete search history.

(56) References Cited

U.S. PATENT DOCUMENTS

| | | |
|---|---|---|
| 2012/0069933 A1 | 3/2012 | Hao et al. |
| 2013/0189930 A1 | 7/2013 | Kinnunen et al. |
| 2015/0358113 A1* | 12/2015 | Callard ................. H04W 28/04 714/776 |
| 2016/0323129 A1 | 11/2016 | Wang |
| 2019/0140784 A1* | 5/2019 | Xi ......................... H04L 1/0063 |

OTHER PUBLICATIONS

ZTE, ZTE Microelectronics, "Consideration on Outer Codes for NR", 3GPP TSG RAN WG1 #86bis, R1-1608976, Agenda item: 8.1.3.1, Oct. 10-14, 2016, Lisbon, Portugal, pp. 1-9.

* cited by examiner

SYSTEM AND METHOD FOR EMPLOYING OUTER CODES WITH NON-EQUAL LENGTH CODEBLOCKS FIELD

PRIORITY

The present application claims priority to U.S. Provisional Patent Application Ser. No. 62/469,687, entitled "SYSTEM AND METHOD FOR EMPLOYING OUTER CODES WITH NON-EQUAL LENGTH CODEBLOCKS", which was filed on Mar. 10, 2017, and which is incorporated herein by reference.

FIELD

The disclosure generally relates to the field of outer codes.

BACKGROUND

In the current Long Term Evolution (LTE) design for high-speed wireless communication, a transport block (TB) is the basic transmission unit for the physical (PHY) layer. A TB typically includes the transmission data payload and parity bits for error detection and/or error correction, such as cyclic redundancy check bits. TBs can be divided into several Forward Error Correction (FEC) code blocks, which are also commonly referred to as "code blocks".

Hybrid-automatic repeat request (H-ARQ) is a retransmission scheme typically based on a combination of high-rate forward error-correcting coding and error-control. In LTE, to save on feedback overhead, H-ARQ retransmission is TB based. An outer code is applied to a set of code blocks to produce outer code information bits, and outer code parity bits are determined based on the outer code information bits.

In conventional applications, the outer codes are essentially erasure codes. The receiver attempts to decode each of the code blocks. If decoding of one or more code blocks fails, the receiver requests a retransmission, possibly specifying how many code blocks have failed, but not necessarily identifying the failed code blocks. Because the transmitter does not know which code blocks failed, the retransmission contains outer code blocks that include redundancy bits for all code blocks, even those that were successfully decoded. The receiver then uses the outer code blocks to recover the failed code blocks.

Examples of suitable outer codes include parity-check codes and Reed-Solomon codes. Depending on the code, some number of failed code blocks can be decoded. When then number of failed code blocks is too high, H-ARQ is used to trigger a retransmission for the TB. These codes are more effective when the number of failed code blocks is small.

There is a desire to have more efficient or more flexible retransmission protocols to correct transmission errors, and to save bandwidth from retransmissions that could be used for other data.

SUMMARY

According to one aspect of the present invention, there is provided a method comprising: generating a plurality of code blocks, each code block comprising a respective set of information bits and a respective set of parity bits encoded based on the respective set of information bits; transmitting the plurality of code blocks; receiving feedback indicating failure to decode the plurality of code blocks; in response to the feedback, and transmitting an outer code block based on the plurality of code blocks; wherein one of the first outer code block and a code block of said plurality of code blocks has fewer information bits than another code block of said plurality of information bits. Optionally, at least two of the code blocks have sets of information bits of differing sizes. Optionally, at least two of the code blocks have sets of information bits larger in size than a set of outer code information bits of the outer code block.

Optionally, for any of the above described embodiments, each set of information bits has a size less than or equal to a first size, wherein generating the outer code block comprises generating the outer code information bits based on a combination of at least two padded sets of information bits, each padded set of information bits based on a corresponding set of information bits of a respective one of the plurality of code blocks, and generating outer code parity bits encoded based on the set of outer code information bits; wherein for each padded set of information bits: when the corresponding set of information bits has a size equal to the first size, the padded set of information bits consists of the corresponding set of information bits; and when the corresponding set of information bits has a size less than the first size, the padded set of information bits consists of the corresponding set of information bits padded with known bits to the first size.

Optionally, for any of the above described embodiments, all but one of the plurality of code blocks have respective sets of information bits of the first size, and one of the plurality of code blocks has the respective set of information bits of a second size smaller than the first size.

Optionally, for any of the above described embodiments, outer code information bits have a size equal to the first size, and the first size is the largest information bit set size among the code blocks.

Optionally, for any of the above described embodiments, the set of outer code information bits has a first size, and generating the outer code information bits is based on respective parts of the respective sets of information bits of at least two code blocks, the respective parts having the first size, at least one of the sets of information bits being larger than the first size, and generating outer code parity bits encoded based on the set of outer code information bits.

Optionally, for any of the above described embodiments, for at least one code block of the plurality of code blocks, the respective set of information bits has the first size.

Optionally, for any of the above described embodiments, for one code block of the plurality of code blocks, the respective set of information bits is larger than the first size by a first amount, and for another code block of the plurality of code blocks, the respective set of information bits is larger than the first size by a second amount different from the first amount.

According to another aspect of the present invention, there is provided a method comprising: receiving a plurality of code blocks, each code block comprising a respective set of information bits and a respective set of parity bits encoded based on the respective set of information bits; decoding each of the plurality of code blocks using the respective set of parity bits to recover the respective set of information bits; upon failure to decode one of the code blocks, transmitting feedback; receiving an outer code block comprising a set of outer code information bits and a set of outer code parity bits encoded based on the set of outer code information bits; decoding the outer code block using the set of outer code parity bits to recover the set of outer code information bits; recovering at least part of the respective set of information bits of the code block that failed to decode based on the outer code information bits and based on the respective set of information bits of at least one correctly decoded code block; wherein one of the first outer code block and a code block of said plurality of code blocks has fewer information bits than another code block of said plurality of information bits. Optionally, at least two of the code blocks have sets of information bits of differing sizes. Optionally at least two of the code blocks have sets of information bits larger in size than the set of outer code information bits.

Optionally, for any of the above described embodiments, the outer code block is generated based on a combination of at least two padded sets of information bits, each padded set of information bits based on a corresponding set of information bits of a respective one of the plurality of code blocks; wherein for each padded set of information bits: when the corresponding set of information bits has a size equal to the first size, the padded set of information bits consists of the corresponding set of information bits; and when the corresponding set of information bits has a size less than the first size, the padded set of information bits consists of the corresponding set of information bits padded with known bits to the first size.

Optionally, for any of the above described embodiments, the outer code block has a set of outer code information bits having a first size, and the outer code information bits are based on respective parts of the respective sets of information bits of at least two code blocks, and a set of outer code parity bits encoded based on the set of outer code information bits; wherein recovering at least part of the respective set of information bits of the code block that failed to decode based on the outer code information bits and based on the respective set of information bits of at least one correctly decoded code block comprises: recovering a first part of the respective set of information bits of the code block that failed to decode based on the respective set of outer code information bits of the at least one outer code block and based on a respective corresponding part of the respective set of information bits of at least one correctly decoded code block; the method further comprising recovering a remaining part of the respective set of information bits of the code block that failed to decode based on the recovered first part and the respective set of parity bits of the code block that failed to decode.

Optionally, for any of the above described embodiments, one of the sets of information bits has the first size, and at least one of the sets of information bits is larger than the first size.

Optionally, for any of the above described embodiments, one of the sets of information bits is larger than the first size by a first amount, and one of the sets of information bits is larger than the first size by a second amount different from the first amount.

According to another aspect of the present invention, there is provided an encoder configured to implement one of the methods summarized above or described herein.

According to another aspect of the present invention, there is provided a transmitter comprising the encoder as summarized above or described herein.

According to another aspect of the present invention, there is provided a decoder configured to implement one of the methods summarized above or described herein.

According to another aspect of the present invention, there is provided a receiver comprising the decoder as summarized above or described herein.

According to another aspect of the present invention, there is provided an apparatus comprising an encoder configured to generate a plurality of code blocks, each code block comprising a respective set of information bits and a respective set of parity bits encoded based on the respective set of information bits; a transmitter configured to transmit the plurality of code blocks; a receiver configured to receive first feedback indicating failure to decode the plurality of code blocks; the encoder further configured to, in response to the feedback, generate a first outer code block based on the plurality of code blocks. The transmitter is further configured to transmit the first outer code block. One of the first outer code block and a code block of said plurality of code blocks has fewer information bits than another code block of said plurality of information bits.

According to another aspect of the present invention, there is provided an apparatus comprising a receiver configured to receive a plurality of code blocks, each code block comprising a respective set of information bits and a respective set of parity bits encoded based on the respective set of information bits; a decoder configured to decode each of the plurality of code blocks using the respective set of parity bits to recover the respective set of information bits; a transmitter configured to, upon failure to decode one of the code blocks, transmit first feedback; the receiver further configured to receive first outer code block comprising a set of outer code information bits and a set of outer code parity bits encoded based on the set of outer code information bits. The decoder is further configured to decode the first outer code block using the set of outer code parity bits to recover the set of outer code information bits, and to recover at least part of the respective set of information bits of the code block that failed to decode based on the outer code information bits and based on the respective set of information bits of at least one correctly decoded code block. One of the first outer code block and a code block of said plurality of code blocks has fewer information bits than another code block of said plurality of information bits.

BRIEF DESCRIPTION OF THE DRAWINGS

Embodiments of the disclosure will now be described with reference to the attached drawings in which.

DETAILED DESCRIPTION

Conventional outer codes are based on code blocks of equal information block length. However, in some instances, it may be desirable to allow code blocks of unequal size within a TB because the size of a TB may not necessarily accommodate an integer number of code blocks exactly. It would be desirable to have a system that allows outer code encoding of transport blocks having differing block sizes.

Figure 1:
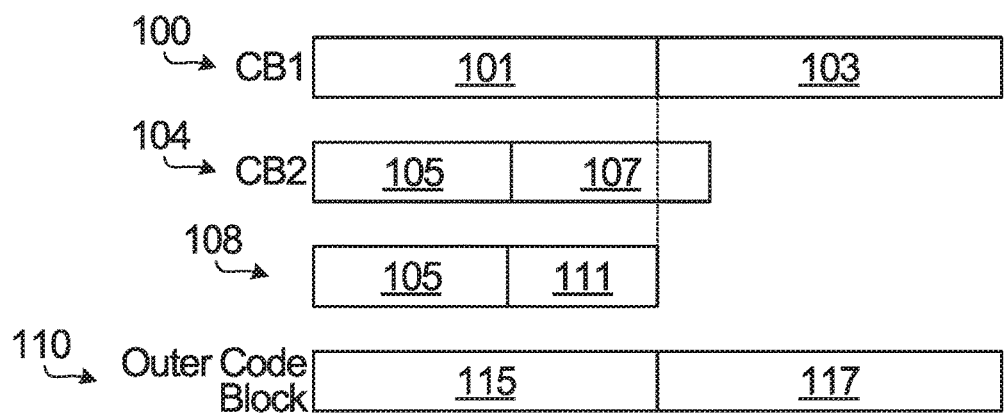
FIG. 1 is diagram showing padding of a code block when encoding an outer code, according to a first embodiment.
Figure 2:
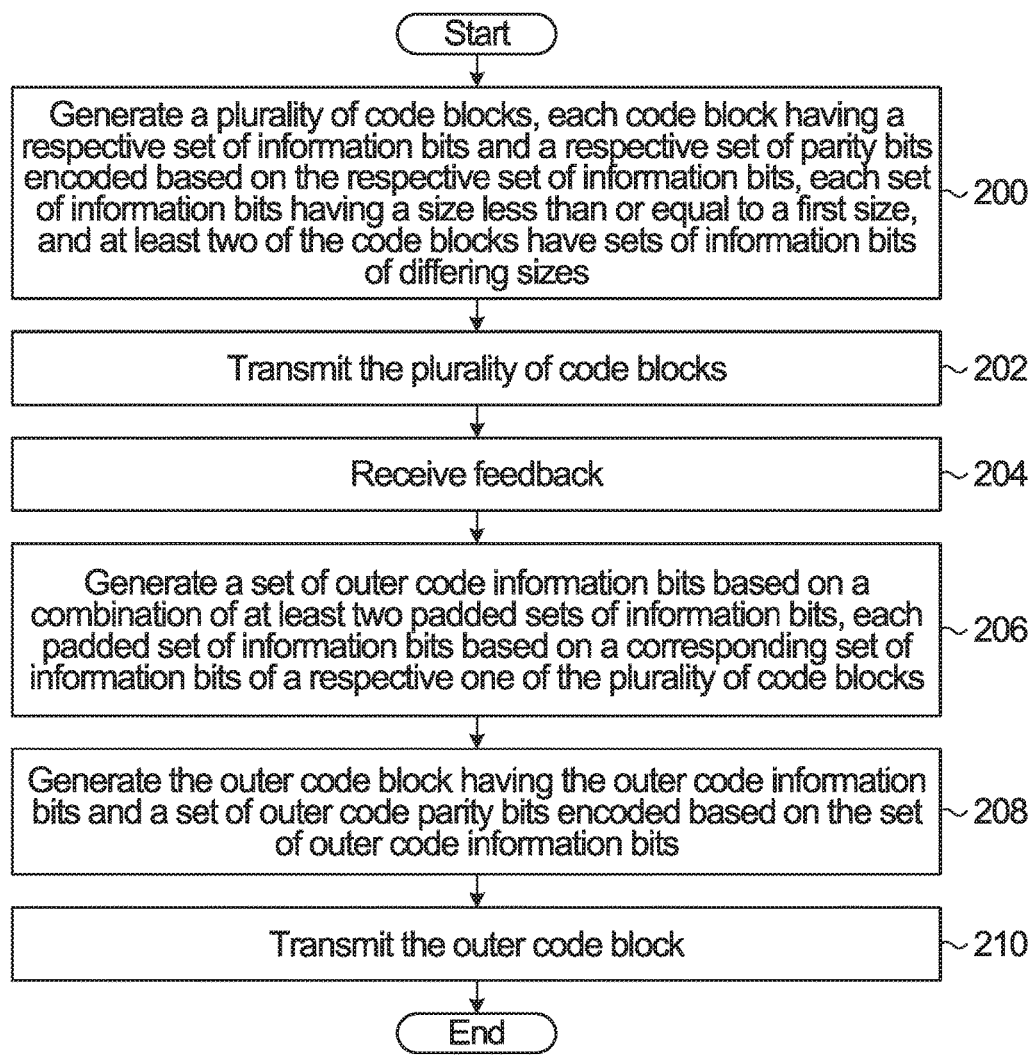
FIG. 2 is a flow diagram showing a method including generating at least one outer code block, according to the first embodiment.
Figure 3:
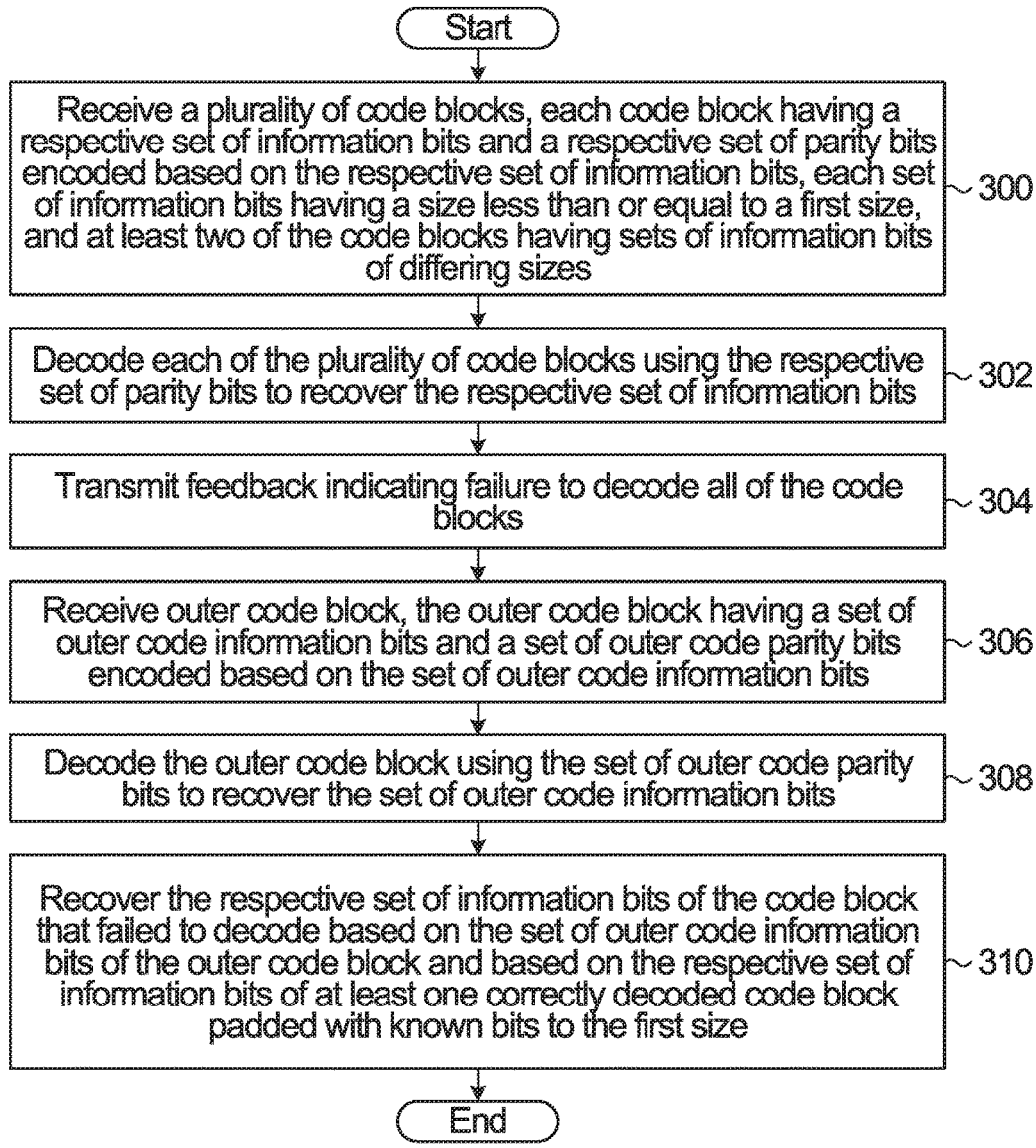
FIG. 3 is a flow diagram showing a method including receiving at least one outer code block, according to the first embodiment.

FIGS. 1 to 3 relate to a first embodiment and will be described together. The first embodiment generally relates to generating outer code blocks based on code blocks that have been padded to all have the same length.

As shown in FIG. 1, a first code block (CB1) 100 has information bits 101, and parity bits 103 generated from the information bits 101. The parity bits 103 function as an error-detecting and/or error-correcting code for the code block 101. Similarly, a second code block (CB2) 104 has information bits 105, and parity bits 107. The parity bits 103, 107 may be generated according to any method known in the art. In the example shown, the first code block 100 has a length that is longer than the second code block 104.

In practice, code blocks may have different sizes because of restrictions in the PHY layer, for example because a specified TB size is not divisible by a fixed code block size. In some embodiments the size difference between the code blocks 100, 104 is relatively small compared to the sizes of the code blocks.

For the purpose of outer code block encoding, the set of information bits 105 of the shorter code block 104 is padded with known padding bits 111 to produce a set of information bits 108, including the information bits 105 and padding bits 111, equal in size to the set of information bits 101. The padded information bits 111 are bits known to both the transmitter and the receiver.

A specific example will now be described in which a TB has 10,000 bits and is composed of two code blocks, CB1 and CB2 of differing sizes. CB1 has 5,240 information bits and CB2 has 4,760 information bits. For the purpose of outer code block encoding, the set of information bits for CB2 is increased through the addition of 480 padding bits to a length of 5240, which is the same as the length of the set of information bits for CB1. The code blocks also include parity bits. For example, if the code rate is ½, then for this example, the number of parity bits in each code block is 5,240 bits as well.

The padded information bits 111 that are added, in an embodiment, are a standardized filled-in pattern of bits. For example, the standardized filled-in pattern may be all "0"s or all "1"s. In some embodiments, the padded information bits are in accordance with a pseudo-random pattern so as to reduce the correlation between transmitted symbols.

In FIG. 1, the size of the padded information bits 111 is equal to the difference in size between the information bits 101 of code block 100 and the information bits 105 of code block 104.

Referring again to FIG. 1, the information bits 101 of CB1 and the set of information bits 108 for CB2 (including the information bits 105 and the padding bits 111) are combined and encoded to produce an outer code block (OCB1) 110, which comprises outer code information bits 115 and outer code parity bits 117. The outer code information bits 115 are generated from the combination of information bits 101 of CB1 and the set of information bits 108. The outer code parity bits 117 are generated from the outer code information bits 115 in a manner similar to the parity bits 103, 107 described above. Optionally, the method further involves transmitting the first and second code blocks 100, 104. If the decoding of code blocks 100,104 succeeds, the method ends. Otherwise, a retransmission containing the outer code block 110 is performed. Note that the padding bits 111 are not transmitted.

Although only two code blocks 100, 104 are shown in FIG. 1, the concepts described herein can be extended to situations where the outer code is applied to more than two code blocks having unequal length. For example, the shorter code blocks may be padded such that all code blocks have the length of the longest code block. In this embodiment, one or more outer codes may be generated that have the same length as the longest code block.

FIG. 2 is a flow diagram of a method of encoding provided by an embodiment of the invention. The method begins with generating a plurality of code blocks at 200. Each code block has a respective set of information bits and a respective set of parity bits encoded based on the respective set of information bits. Each set of information bits has a size less than or equal to a first size, and at least two of the code blocks have sets of information bits of differing sizes.

The method continues at 202 with transmitting the plurality of code blocks. For a code block that is not padded, the code block is transmitted, and for a code block for which padding was applied for the purpose of computing the outer code block, it is the original code block containing the original shorter set of information bits plus the original parity bits that is transmitted.

In block 204, the feedback is received indicating the plurality of code blocks were not all correctly received. This will only be the case when at least one code block failed to decode in the receiver. The method continues in block 206 with generating a set of outer code information bits for an outer code block. The set of outer code information bits is generated based on a combination of at least two padded sets of information bits, each padded set of information bits based on a corresponding set of information bits of a respective one of the plurality of code blocks. In some embodiments, this step may be repeated to generate multiple outer code blocks.

The method continues with generating the outer code block at 208. The outer code block contains the set of outer code information bits and a set of outer code parity bits encoded based on the set of outer code information bits.

For each padded set of information bits, when the corresponding set of information bits has a size equal to the first size, the padded set of information bits consists of the corresponding set of information bits. When the corresponding set of information bits has a size less than the first size, the padded set of information bits consists of the corresponding set of information bits padded with known bits to the first size.

Finally, the outer code block is transmitted at 210.

In some embodiments, all but one of the plurality of code blocks have respective sets of information bits of the first size, and one of the plurality of code blocks has the respective set of information bits of a second size smaller than the first size. In this case, only the information bits for the code block with the smaller set of information bits are padded for the purpose of outer code computation.

The outer code blocks have sets of outer code information bits that have a size equal to the first size. In some embodiments, the first size is the largest information bit set size among the code blocks.

Turning now to FIG. 3, shown is a flow diagram of a method of decoding provided by an embodiment of the invention. This method pertains to receipt and decoding of code blocks and outer code blocks transmitted using the method of FIG. 2. The method begins at 300 with receiving a plurality of code blocks. Each code block contains a respective set of information bits and a respective set of parity bits encoded based on the respective set of information bits. Each set of information bits has a size less than or equal to a first size, and at least two of the code blocks have sets of information bits of differing sizes.

The method continues at 302 with decoding each of the plurality of code blocks, using the respective set of parity bits to recover the respective set of information bits. If at least one of the code blocks fails to decode, the method continues at 304 with transmitting feedback indicating failure to decode all of the code blocks. The feedback does not indicate a specific code block. The method continues at 306 with receiving an outer code block. The outer code block contains a set of outer code information bits and a set of outer code parity bits encoded based on the set of outer code information bits.

The method continues at 308 with decoding the one outer code block using the set of outer code parity bits to recover the set of outer code information bits.

The failed code block may be a code block that was padded in the transmitter for the purpose of generating the outer code block, or it may be a code block that was not padded in the transmitter for the purpose of generating the outer code block. If the code block that failed was the code block that was padded in the transmitter for the purpose of generating the outer code block, the information bits of that code block can be recovered based on corresponding parts of the outer code block and the other correctly decoded information block. The corresponding parts being equal in size to the set of information bits of the failed code block. On the other hand, if the code block that failed was a code block that was not padded in the transmitter for the purpose of generating the outer code block, then the information bits of at least one correctly decoded code block (that was padded in the transmitter for generation of the outer block code) are padded in the receiver to the first size using the known padding bits. This second scenario is depicted in FIG. 3. At 310, the receiver recovers the respective set of information bits of the code block that failed to decode based on the set of outer code information bits and based on the respective set of information bits of at least one correctly decoded code block padded with known bits to the first size.

FIGS. 4 to 7 relate to a second embodiment, and will be described together. This embodiment generally relates to generating outer code blocks that are shorter than the length of the longest code block.

Figure 4:
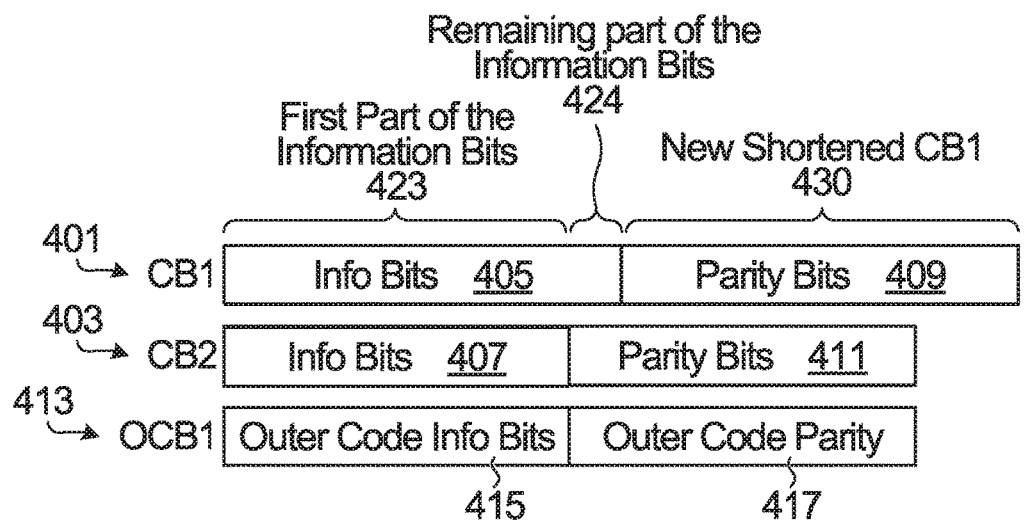
FIG. 4 is a diagram showing outer code generation, where an outer code block has a length equal to a length of a shortest code block, according to a second embodiment.

As shown in FIG. 4, a first code block (CB1) 401 comprises information bits 405 and parity bits 409. Further, a second code block (CB2) 403 comprises information bits 407 and parity bits 411. The parity bits 409, 411 function in the same manner as the parity bits 103, 107 discussed above. As shown in FIG. 4, code block 401 is longer than code block 403, and information bits 405 are longer than information bits 407. The information bits 405 of code block 401 include a first part 423 of the information bits equal in length to the set of information bits 407 in the other code block 403, and a remaining part of of information bits 424. Although depicted as two adjacent sets of bits 423, 424, more generally, the set of information bits 405 can be divided in any manner to form the two sets 423,424.

The code blocks 401, 403 are outer code encoded to generate an outer code block (OCB1) 413 that has a length that is the shorter than at least one of the two code blocks 401,403, namely CB1 401. In some embodiments, the outer code block has a length that is the same as the shorter of the two code blocks. In another embodiment, the outer code block has a length that is between the shortest code block length and the longest code block length, and for the purpose of calculating the outer code block, the shortest code block is padded with known bits as per the embodiment described above.

The outer code block 413 comprises outer code information bits 415 that are based on the information bits 407 of the shorter code block 401, and the first part 423 of the information bits of the longer code block 401. The outer code block 413 also includes outer code parity bits 417 computed from the outer code information bits 415. The outer code parity bits 415 function in a similar manner to the outer code panty bits 117, discussed above, and in some embodiments can be used to decode a subset of the data bits of any code block 401, 403 equal in length to the information bits 415 of the outer code block. In FIG. 4 the length of the outer code block 413 is the same as the length of the code block 403.

In the embodiment shown in FIG. 4, if either one of code blocks 401, 403 fails, then feedback is transmitted followed by receipt of the outer code block 413. Then, the failed code block may be recovered using, at least in part, the other successfully received code block and the outer code block 413, assuming the outer code block 413 can be correctly decoded. This begins with decoding the outer code block 413 making use of the outer code parity bits 417.

For example, if code block 403 is received in error, the information bits 407 may be recovered by using the code block 401 and the outer code block 413. In a simple example, the outer code information bits 415 are the XOR sum of the first part 423 of the information bits of the first code block 401 and the information bits 407 of the second code block 403. In this case, the information bits 405 and the outer code information bits 415 can be used to recover information bits 407. On the other hand, if the code block 401 is received in error, the first part 423 of the information bits 405 may be recovered using a similar method as described above by using the information bits 407 and the outer code information bits 415. The remaining part 424 of the information bits cannot be decoded based on the outer code block 413 and the correctly decoded code block 403. However, the remaining part 424 of information bits may be recovered using the correctly decoded portion 423, and the parity bits 409.

Although only two code blocks 401, 403 are shown in FIG. 4, in an embodiment, the principle demonstrated in FIG. 4 may be extended to outer code blocks based on more than two code blocks. In general, there will be two or more code blocks, and one or more outer code blocks. In these embodiments, the additional code blocks may have lengths that are shorter, the same length as, or longer than the outer code block 413.

Figure 5:
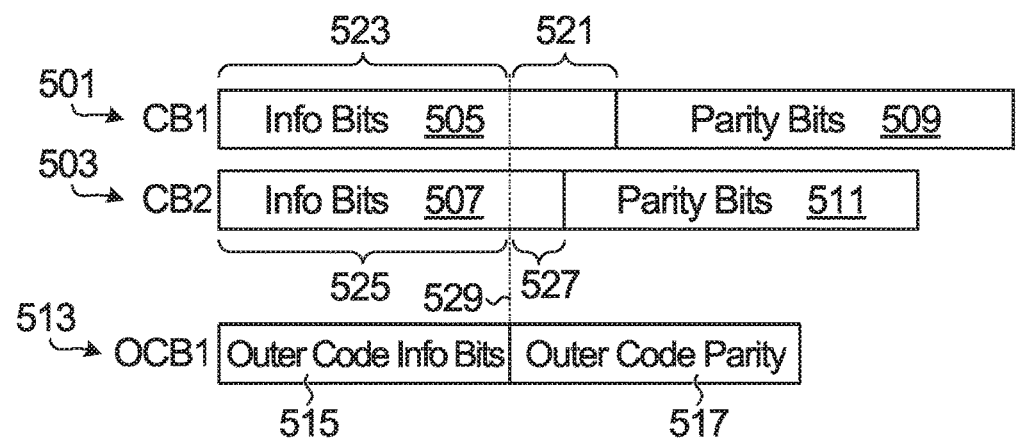
FIG. 5 is a diagram showing outer code block generation, where an outer code block has a length shorter than a length of a shortest code block, according to the second embodiment.

FIG. 5 illustrates another embodiment where the outer code block is shorter than the shortest code block. The embodiment shown in FIG. 5 extends the method of combining outer code with soft decoding to finer H-ARQ retransmission. In conventional H-ARQ, coded outer code information bits are transmitted to help the receiver to decode the data, together with the originally received (soft value) coded bits. The effect is a lowered coding rate. With this embodiment, a similar effect is achieved through the use of the correctly decoded information bits, so as to lower the effective coding rate. To decode the rest of the unknown information bits, the receiver uses the originally received (soft value) coded bits. The difference is that now the receiver knows most of the bits it needs to decode, and hence decoding the rest of the information bits can be performed using the known information and parity bits.

Referring to FIG. 5, a code block (CB1) 501 contains information bits 505 and parity bits 509, and a code block (CB2) 503 contains information bits 507 and parity bits 511. The parity bits 509, 511 function similarly to the parity bits 409, 411, described above. As shown in FIG. 5, the code block 501 is longer than the code block 503. In particular, the information bits 505 are longer than the information bits 507.

FIG. 5 also shows an outer code block (OCB1) 513, which may be similar to the outer code block 413 described above, and comprises outer code information bits 515 and outer code parity bits 517. As can be seen from FIG. 5, a difference between the outer code block 513 and the outer code block 413 is that outer code block 513 is shorter than both the code block 501 and the code block 503. The outer code information bits 515 are based on a first part 523 of information bits of the first code block 501 and a first part 525 of the information bits of the second code block 503. Both first sets of information bits 523, 525 are equal in length to the outer code information bits 515. The first code block 501 has a remaining set 521 of information bits that are not protected by the outer code block 513, and the second code block 503 has a remaining set 527 of information bits that are not protected by the outer code block 513.

In the embodiment shown in FIG. 5, if the code block 501 fails it may be recovered in a similar manner to the code block 401, as described above. Feedback is sent indicating that the code blocks were not all correctly decoded, and in response outer code block 513 is received. A portion 523 of the (now failed) code block 501 may be recovered using the first part 525 of the information bits and the outer code information bits 515, and the remaining part 521 of the information bits of the code block 501 may be recovered using the now correctly decoded first part 523 of the information bits and the parity bits 509, at a lower effective code rate. If the code block 503 fails it may also be recovered in a similar manner. Specifically, the first part 525 of the information bits of the code block 503 may be recovered using the first part 523 of information bits and the outer code information bits 515, and the remaining part 527 of information bits of the code block 503 may be recovered using the now correctly decoded first part 525 of the information bits and the parity bits 511, at a lower effective code rate.

A result of the second embodiment is that the code blocks are not required to be of equal length in outer code based H-ARQ. This can make outer code based H-ARQ more efficient and flexible. Furthermore, FIGS. 4 and 5 show embodiments where retransmission of an outer code shorter than a code block can enable the decoding of the code block with a lower effective code rate. This may help to increase the error correction capability of the code block.

Figure 6:
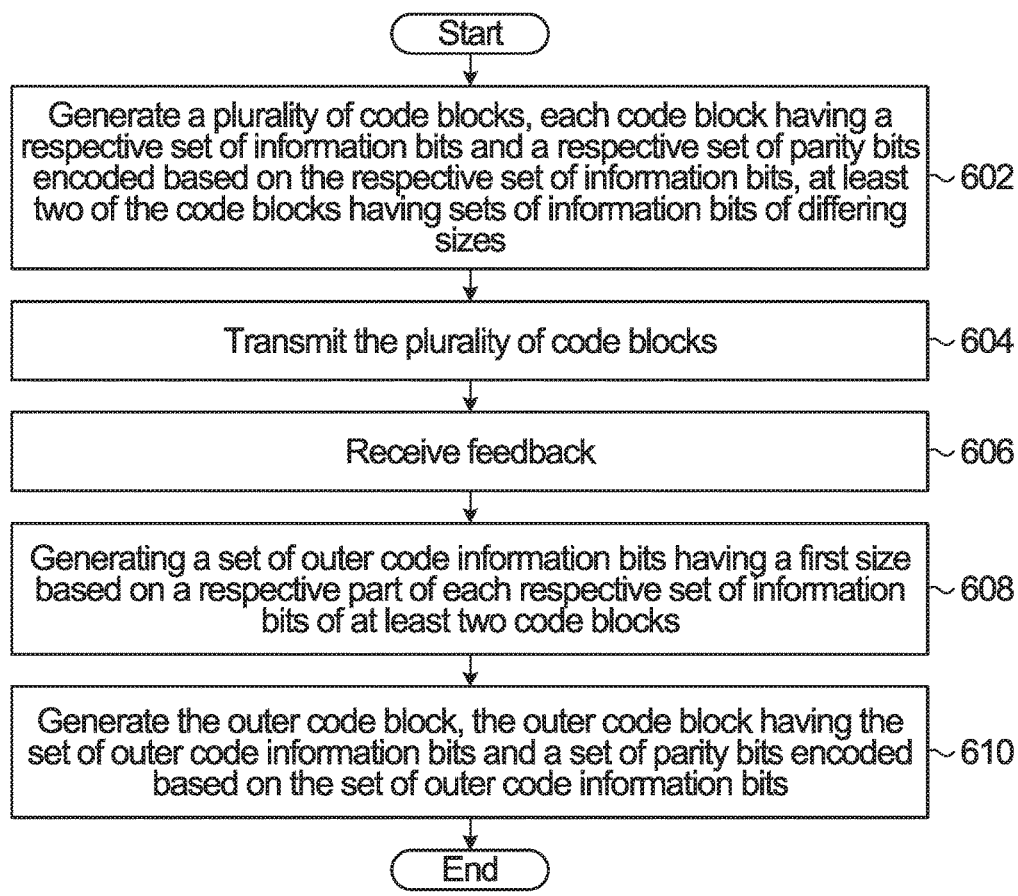
FIG. 6 is a flow diagram showing a method including generating an outer code block, according to the second embodiment.

FIG. 6 is a flow diagram of a method provided by an embodiment of the invention. The method begins with generating a plurality of code blocks at 602. Each code block contains a respective set of information bits and a respective set of parity bits encoded based on the respective set of information bits. At least two of the code blocks have sets of information bits of differing sizes. The code blocks are transmitted at 604. Feedback may be received at 606, indicating that one or more code blocks was not successfully decoded at the receiver.

The method continues at 608 with generating a set of outer code information bits. The outer code information bits have a first size, and are based on a respective part of each respective set of information bits of at least two code blocks. For a code block having a set of information bits equal to the first size, the respective part includes all of the information bits. For a code block having a set of information bits larger in size than the first size, the respective part includes a subset of bits equal in size to the first size. The method continues at 610 with generating the outer code block containing the set of outer code information bits and a set of parity bits encoded based on the set of outer code information bits.

In an embodiment, the set of information bits for one code block is equal in size to the first size and the set of information bits for another code block is larger in size than the first size. This is consistent with the example of FIG. 4.

In a further embodiment, two code blocks are larger than the first size by differing amounts. This is consistent with the example of FIG. 5.

Figure 7:
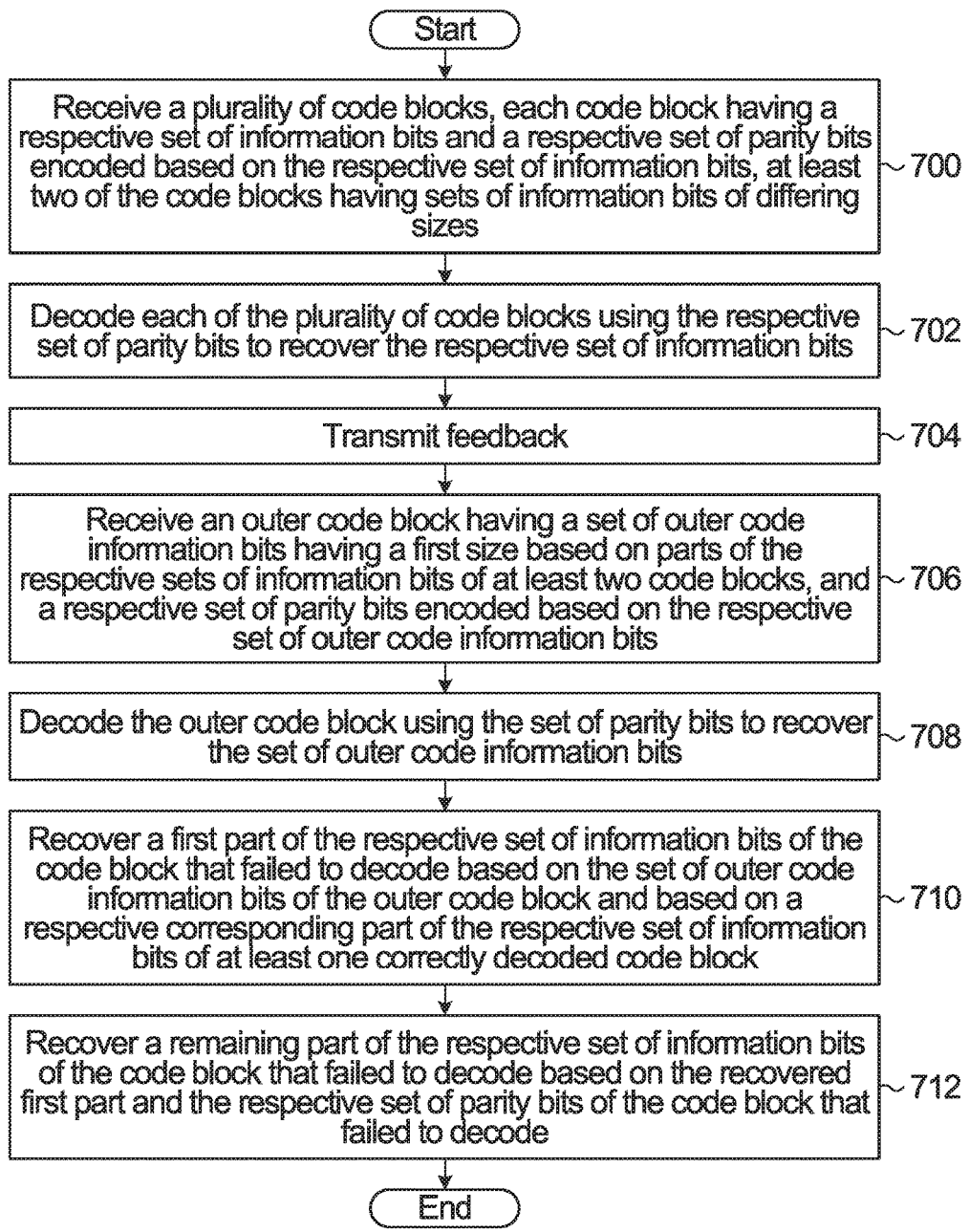
FIG. 7 is a flow diagram showing a method including receiving at least one outer code block, according to the second embodiment.

Turning now to FIG. 7, shown is a flow diagram of a decoding method provided by an embodiment of the invention. The method begins with receiving a plurality of code blocks at 700. Each code block contains a respective set of information bits and a respective set of parity bits encoded based on the respective set of information bits. At least two of the code blocks have sets of information bits of differing sizes. At 702, the method continues with decoding each of the plurality of code blocks using the respective set of parity bits to recover the respective set of information bits. If at least one code block fails to decode, feedback is transmitted at 704.

The method continues with receiving an outer code block at 706. The outer code block contains a set of outer code information bits having a first size based on respective parts of the respective sets of information bits of at least two code blocks, and a set of parity bits encoded based on the set of outer code information bits.

The method continues at 708 with decoding the outer code block. Where the failed code block is a code block whose part of the respective set of information bits is less than all of the information bits i.e. the respective set of information bits for the failed code block includes a first part of information of the first size and a remaining set of information bits, the method continues at 710 with recovering the first part of the respective set of information bits that failed to decode. Recovering the first part of the respective set of information bits of the code block that failed to decode is based on the set of outer code information bits of the outer code block and based on a respective corresponding part of the respective set of information bits of at least one correctly decoded code block. The method continues in block 712 with recovering a remaining part of the respective set of information bits of the code block that failed to decode. Recovering the remaining part of the respective set of information bits of the code block that failed to decode is based on the recovered first part and the respective set of parity bits of the code block that failed to decode.

In some embodiments, for the method of FIG. 7, for one of the at least one outer code blocks, the outer code information bits are based on at least one set of information bits from a code block of the first size and at least one set of information bits of the first size from a code block that is longer than the first size.

Figure 8:
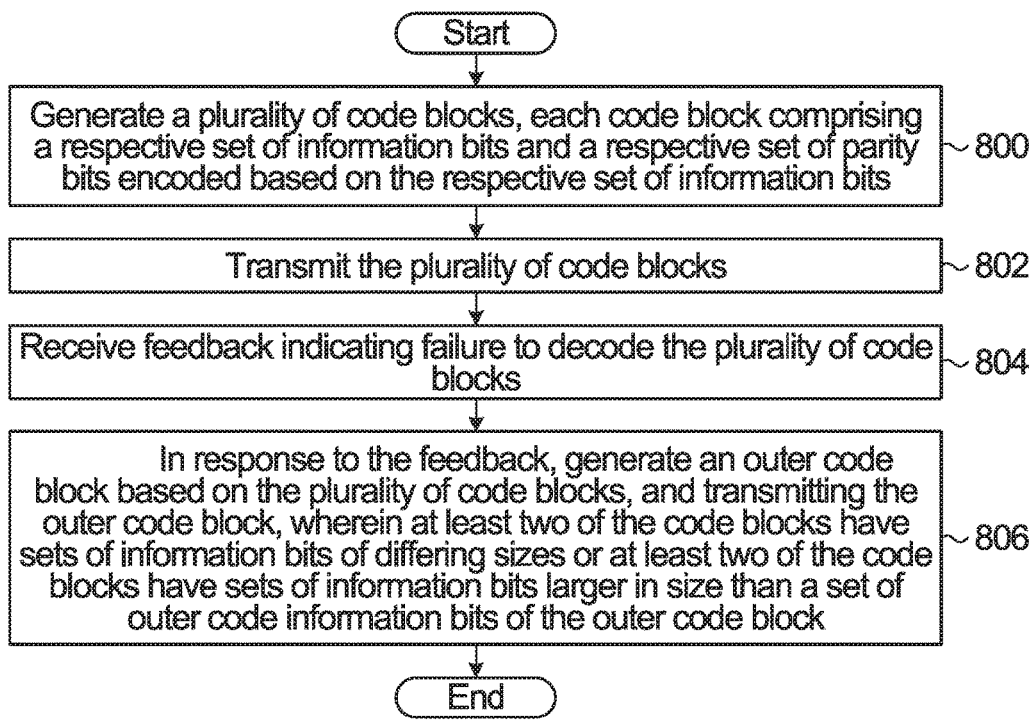
FIG. 8 is a flow diagram of another encoding method provided by an embodiment of the invention.
Figure 9:
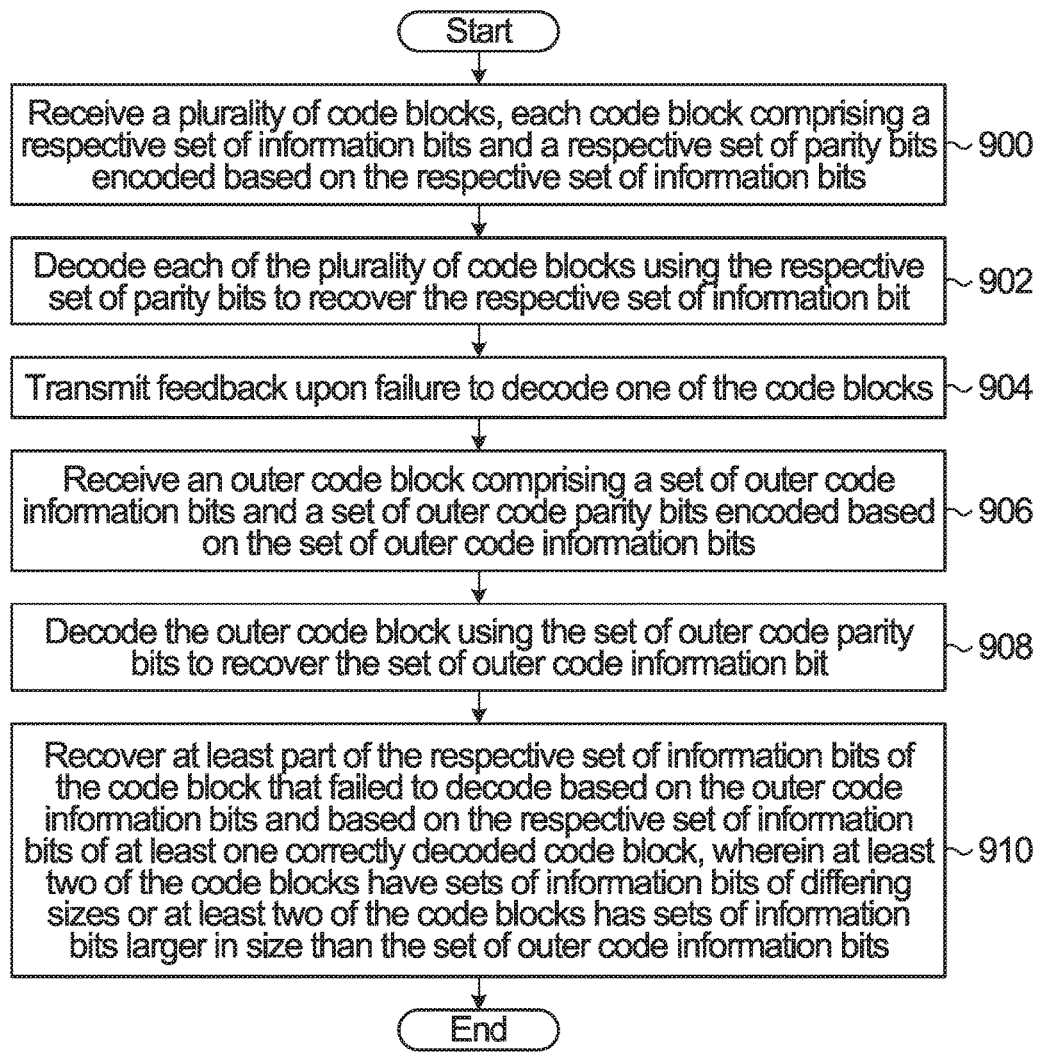
FIG. 9 is a flow diagram of another decoding method provided by an embodiment of the invention.

In the first set of embodiments, padding is employed to produce code blocks having a common size, for the purpose of outer code encoding. In the second set of embodiments, outer code blocks are determined based on code blocks larger in size than the outer code blocks. FIGS. 8 and 9 are flow diagrams of encoding and decoding methods which are generalizations of the two sets of embodiments. Referring first to FIG. 8, the encoding method begins with generating a plurality of code blocks, each code block comprising a respective set of information bits and a respective set of parity bits encoded based on the respective set of information bits at 800. The plurality of code blocks are transmitted at 802. At 804, feedback is received indicating failure to decode the plurality of code blocks. At 806, in response to the feedback, an outer code block is generated based on the plurality of code blocks, and the outer code block is transmitted. At least two of the code blocks have sets of information bits of differing sizes or at least two of the code blocks have sets of information bits larger in size than a set of outer code information bits of the outer code block. An alternative way of stating these same two possibilities is that one of the outer code block and a code block of said plurality of code blocks has fewer information bits than another code block of said plurality of information bits.

Referring now to FIG. 9, the decoding method begins with receiving a plurality of code blocks, each code block comprising a respective set of information bits and a respective set of parity bits encoded based on the respective set of information bits at 900. The method continues with decoding each of the plurality of code blocks using the respective set of parity bits to recover the respective set of information bits at 902. At 904, feedback is transmitted upon failure to decode one of the code blocks. At 906, an outer code block is received comprising a set of outer code information bits and a set of outer code parity bits encoded based on the set of outer code information bits. At 908, the outer code block is decoded using the set of outer code parity bits to recover the set of outer code information bits. At 910, at least part of the respective set of information bits of the code block that failed to decode is recovered based on the outer code information bits and based on the respective set of information bits of at least one correctly decoded code block, wherein at least two of the code blocks have sets of information bits of differing sizes or at least two of the code blocks has sets of information bits larger in size than the set of outer code information bits.

Figure 10:
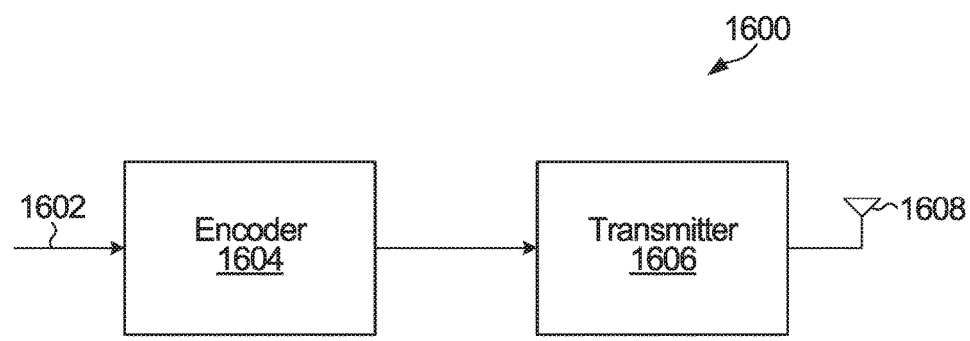
FIG. 10 is a block diagram of an example apparatus for encoding and transmitting codewords.

FIG. 10 is a block diagram of an apparatus for encoding and transmitting codewords. The apparatus 1600 includes an encoder 1604 coupled to a transmitter 1606. The encoder 1604 is implemented in circuitry that is configured to encode an input bit stream 1602 as disclosed herein. In the illustrated embodiment, the apparatus 1600 also includes an antenna 1608, coupled to the transmitter 1606, for transmitting signals over a wireless channel. In some embodiments, the transmitter 1606 includes a modulator, an amplifier, and/or other components of an RF transmit chain.

The encoder 1604 is implemented in circuitry, such as a processor, that is configured to encode input bits as disclosed herein. In a processor-based implementation of the encoder 1604, processor-executable instructions to configure a processor to perform encoding operations are stored in a non-transitory processor-readable medium. The non-transitory medium could include one or more solid-state memory devices and/or memory devices with movable and possibly removable storage media. The transmitter 1606 is coupled to the encoder 1604, to transmit the codewords. The encoder 1604 could implement any of various other features that are disclosed herein.

In some alternative embodiments, the functionality of the encoder 1604 and transmitter 1606 described herein may be fully or partially implemented in software or modules, for example in encoding and transmitting modules stored in a memory and executed by a processor(s) of the apparatus 1600.

Figure 11:
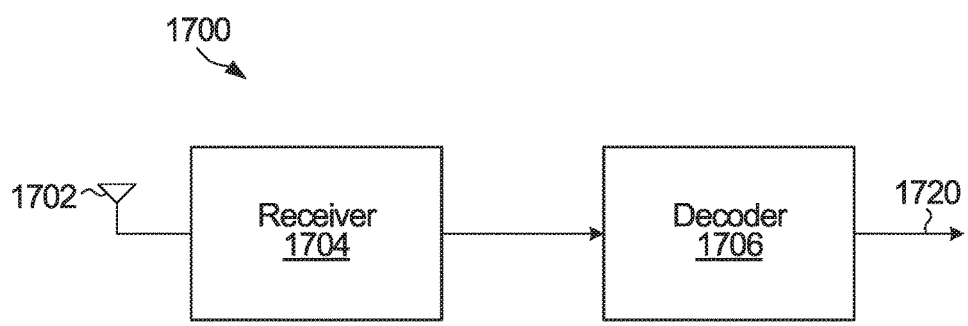
FIG. 11 is a block diagram of an example apparatus for receiving and decoding codewords.

FIG. 11 is a block diagram of an example apparatus for receiving and decoding codewords. The apparatus 1700 includes a receiver 1704 coupled to an antenna 1702 for receiving signals from a wireless channel, and a decoder 1706. In some embodiments, the receiver 1704 includes a demodulator, an amplifier, and/or other components of an RF receive chain. The receiver 1704 receives, via the antenna 1702, a word that is based on a codeword of a polar code. Decoded bits are output at 1720 for further receiver processing.

In some embodiments, the apparatus 1700, and similarly the apparatus 1600 in FIG. 10 as noted above, include a non-transitory computer readable medium that includes instructions for execution by a processor to implement and/or control operation of the encoder 1604 in FIG. 10, to implement and/or control operation of the decoder 1706 in FIG. 11, and/or to otherwise control the execution of methods described herein. In some embodiments, the processor may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which could be, for example, a compact disc read-only memory (CD-ROM), universal serial bus (USB) flash disk, or a removable hard disk.

The decoder 1706 is configured to decode received codewords. Assistant bits could be used by the decoder 1706 to assist in decoding.

In some alternative embodiments, the functionality of the receiver 1704 and decoder 1706 described herein may be fully or partially implemented in software or modules, for example in receiving and decoding modules stored in a memory and executed by a processor(s) of the apparatus 1700.

Communication equipment could include the apparatus 1600, the apparatus 1700, or both a transmitter and a receiver and both an encoder and a decoder. Such communication equipment could be user equipment or communication network equipment.

Figure 12:
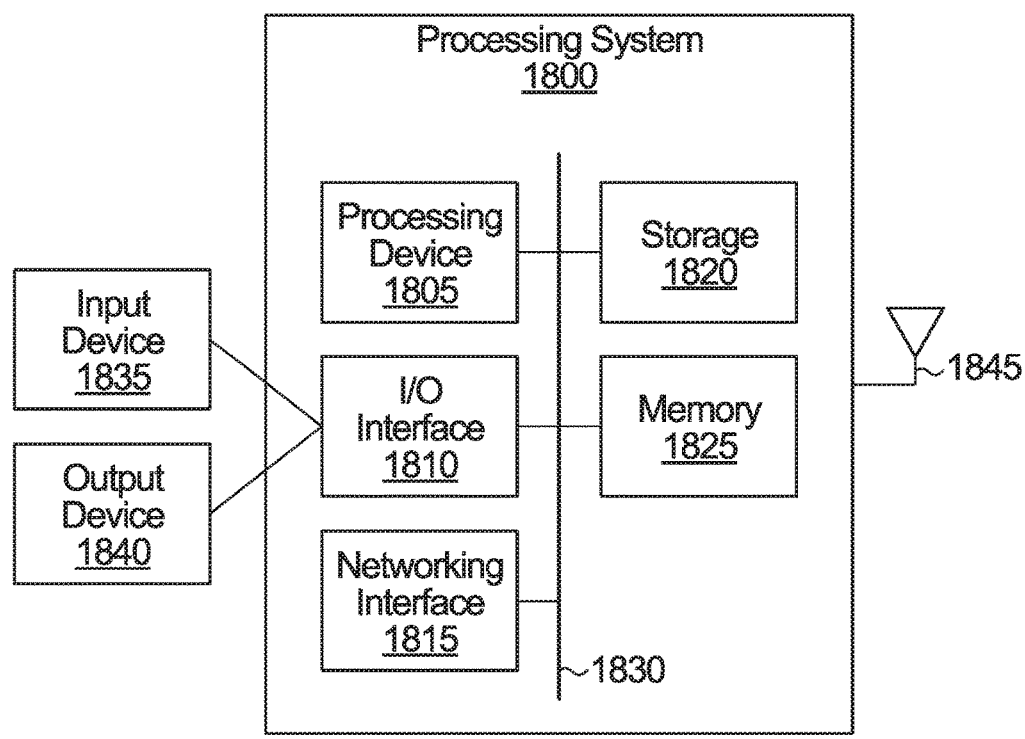
FIG. 12 is a block diagram of an example simplified processing system, which may be used to implement embodiments disclosed herein.

FIGS. 10 and 11 are generalized block diagrams of apparatus that could be used to implement blind code rate detection and decoding, and encoding of information for decoding by blind code rate detection. FIG. 12 is a block diagram of an example simplified processing system 1800, which may be used to implement embodiments disclosed herein, and provides a higher level implementation example. The apparatus 1600, the apparatus 1700, or both, may be implemented using the example processing system 1800, or variations of the processing system 1800. The processing system 1800 could be a server or a mobile device, for example, or any suitable processing system. Other processing systems suitable for implementing embodiments described in the present disclosure may be used, which may include components different from those discussed below. Although FIG. 12 shows a single instance of each component, there may be multiple instances of each component in the processing system 1800.

The processing system 1800 may include one or more processing devices 1805, such as a processor, a microprocessor, an application-specific integrated circuit (ASIC), a field-programmable gate array (FPGA), a dedicated logic circuitry, or combinations thereof. The processing system 1800 may also include one or more input/output (I/O) interfaces 1810, which may enable interfacing with one or more appropriate input devices 1835 and/or output devices 1840. The processing system 1800 may include one or more network interfaces 1815 for wired or wireless communication with a network (e.g., an intranet, the Internet, a P2P network, a WAN and/or a LAN) or other node. The network interfaces 1815 may include wired links (e.g., Ethernet cable) and/or wireless links (e.g., one or more antennas) for intra-network and/or inter-network communications. The network interfaces 1815 may provide wireless communication via one or more transmitters or transmit antennas and one or more receivers or receive antennas, for example. In this example, a single antenna 1845 is shown, which may serve as both transmitter and receiver. However, in other examples there may be separate antennas for transmitting and receiving. The processing system 1800 may also include one or more storage units 1820, which may include a mass storage unit such as a solid state drive, a hard disk drive, a magnetic disk drive and/or an optical disk drive.

The processing system 1800 may include one or more memories 1825, which may include a volatile or non-volatile memory (e.g., a flash memory, a random access memory (RAM), and/or a read-only memory (ROM)). The non-transitory memories 1825 may store instructions for execution by the processing devices 1805, such as to carry out examples described in the present disclosure. The memories 1825 may include other software instructions, such as for implementing an operating system and other applications/functions. In some examples, one or more data sets and/or modules may be provided by an external memory (e.g., an external drive in wired or wireless communication with the processing system 1800) or may be provided by a transitory or non-transitory computer-readable medium. Examples of non-transitory computer readable media include a RAM, a ROM, an erasable programmable ROM (EPROM an electrically erasable programmable ROM (EEPROM), a flash memory, a CD-ROM, or other portable memory storage.

There may be a bus 1830 providing communication among components of the processing system 1800. The bus 1830 may be any suitable bus architecture including, for example, a memory bus, a peripheral bus or a video bus. In FIG. 12, the input devices 1835 (e.g., a keyboard, a mouse, a microphone, a touchscreen, and/or a keypad) and output devices 1840 (e.g., a display, a speaker and/or a printer) are shown as external to the processing system 1800. In other examples, one or more of the input devices 1835 and/or the output devices 1840 may be included as a component of the processing system 1800.

Some of the embodiments described above have involved transmitting feedback at the transport block level, for transport blocks composed of multiple code blocks having differing information block sizes. In some of the specific examples, the feedback is hybrid automatic repeat request (HARQ) feedback. This particular application would typically be employed at a sub-MAC (medium access control) layer. However, it should be understood that the described embodiments can be applied to other layers, for example higher layers.

In the described embodiments, (which may be based on HARQ feedback), the original received codeblock that fails to decode, including its parity bits, is kept at the receiver. Because of this, when some of the information bits are decoded with the assistance of an outer code, the remaining bits can be decoded by the original codeblock, which now has a lower effective code rate.

However, in some embodiments, a received codeblock in error is discarded. This approach may be employed in some higher layer applications, for example. This may, for example, be the case where no PHY layer FEC decoding is performed at the high layer. In such embodiments, the receiver recovers the erroneous codeblock based on other correctly decoded code blocks and an outer codeblock without reliance on the erroneous codeblock per se.

In a first example, an outer codeblock is generated which is aligned with the longest codeblock (similar to the example of FIG. 1). For the purpose of computing the outer codeblock, codeblocks shorter than the longest codeblock are padded to the length of the longest codeblock. At the receiver, when one of the codeblocks fails to decode, the receiver transmits feedback (e.g. a negative acknowledgement (NACK)), and in response to that the outer codeblock is transmitted. When the outer codeblock is decoded, regardless of which codeblock is in error, the erroneous codeblock can is recovered using the outer codeblock and another correctly decoded codeblock. This is possible even if the erroneous codeblock is discarded in its entirety. An advantage of this option is low latency, in that regardless of which codeblock is in error, a single outer code block transmission is based on the longest codeblock and can be used to recover the failed codeblock, including the longest codeblock if that is the one that failed; the disadvantage is efficiency, because if a short codeblock is in error, some information bits in the outer code are redundant.

In a second example, a first outer codeblock is generated which is aligned with a short codeblock (similar to the example of FIG. 4). The information bits of the longer codeblock include a part that has the same length as the outer codeblock information bits (and same as the short code block information bits) and a remaining part. At the receiver, when a codeblock fails to decode, the receiver transmits first feedback (e.g. a first NACK) at the upper layer indicating that one or more codeblocks is in error, which also means that a transport block is in error, and in response to that a first outer codeblock is transmitted. If the short codeblock is in error, and if the first outer codeblock is successfully decoded, it will be possible to recover the original short code-block. If a long codeblock is in error (one longer than the first outer code block), the receiver transmits second feedback (e.g. a second NACK), and in response to that, a second outer code block is transmitted based on the remaining information bits of the long code block. If this were applied to the code blocks of FIG. 4, then the remaining part of the information bits 424 are retransmitted as part of a second outer codeblock transmission. The second outer code block is based on the remaining part of the information bits and parity based on those bits. For example, the second outer code block may contain the remaining part of the information bits and parity bits based on those bits. A disadvantage of this option is higher latency and additional NACK signalling. An advantage is efficiency, in that no information bits in the outer code blocks are unused. Now, since the original erroneous long code block may have been discarded, part of the long code block can be decoded based on the first outer code block and the information bits of a correctly received code block, and the remaining part can be decoded based on the second outer code block.

In another embodiment, for the second outer code block referred to above, the outer code information bits include the remaining part of the information bits combined with information bits (e.g. FEC decoded information bits) of another code block (which may, for example be of a different user or of a different transport block for the same user). The bits are combined to share the same FEC codeblock (for example encoded into the same LDPC codeblock). The purpose of this is to use a longer FEC codeblock (compared to transmitting a codeblock based only on the remaining part of the information bits) to improve FEC performance, in view of the fact that shorter FEC codeblocks have smaller coding/diversity gain.

Numerous modifications and variations of the present disclosure are possible in light of the above teachings. It is therefore to be understood that within the scope of the appended claims, the disclosure may be practiced otherwise than as specifically described herein.

The invention claimed is:

1. A method comprising:
generating a plurality of code blocks, each code block comprising a respective set of information bits and a respective set of parity bits encoded based on the respective set of information bits;
transmitting the plurality of code blocks;
receiving first feedback indicating failure to decode the plurality of code blocks; and
in response to the feedback, transmitting a first outer code block based on the plurality of code blocks;
wherein one of the first outer code block and a code block of said plurality of code blocks has fewer information bits than another code block of said plurality of information bits.

2. The method of claim 1 wherein at least two of the code blocks have sets of information bits of differing sizes.

3. The method of claim 1 wherein at least one of the code blocks have sets of information bits larger in size than a set of outer code information bits of the first outer code block.

4. The method of claim 1 wherein each set of information bits has a size less than or equal to a first size, wherein generating the first outer code block comprises generating the outer code information bits based on a combination of at least two padded sets of information bits, each padded set of information bits based on a corresponding set of information bits of a respective one of the plurality of code blocks, and generating outer code parity bits encoded based on the set of outer code information bits;
wherein for each padded set of information bits:
when the corresponding set of information bits has a size equal to the first size, the padded set of information bits consists of the corresponding set of information bits; and
when the corresponding set of information bits has a size less than the first size, the padded set of information bits consists of the corresponding set of information bits padded with known bits to the first size.

5. The method of claim 4 wherein all but one of the plurality of code blocks have respective sets of information bits of the first size, and one of the plurality of code blocks has the respective set of information bits of a second size smaller than the first size.

6. The method of claim 4 wherein outer code information bits have a size equal to the first size, and the first size is the largest information bit set size among the code blocks.

7. The method of claim 1 wherein the set of outer code information bits has a first size, and generating the outer code information bits is based on respective parts of the respective sets of information bits of at least two code blocks, the respective parts having the first size, at least one of the sets of information bits being larger than the first size, and generating outer code parity bits encoded based on the set of outer code information bits.

8. The method of claim 7 wherein for at least one code block of the plurality of code blocks, the respective set of information bits has the first size.

9. The method of claim 8 wherein:
receiving first feedback comprises receiving higher layer feedback indicating failure of a transport block containing the plurality of code blocks;
one of the sets of information bits is larger than the first size, the one set including the respective part having the first size and a remaining part;
the method further comprising:
receiving second feedback indicating failure to decode the plurality of code blocks; and
in response to the second feedback, transmitting a second outer code block based on the remaining part.

10. The method of claim 9 wherein the second outer code block based on the remaining part is based on the remaining part and at least one bit of another code block.

11. The method of claim 7 wherein for one code block of the plurality of code blocks, the respective set of information bits is larger than the first size by a first amount, and for another code block of the plurality of code blocks, the respective set of information bits is larger than the first size by a second amount different from the first amount.

12. The method of claim 1 wherein receiving first feedback comprises receiving hybrid automatic repeat request (HARQ) feedback.

13. The method of claim 1 wherein receiving first feedback comprises receiving higher layer feedback indicating failure of a transport block containing the plurality of code blocks.

14. A method comprising:
receiving a plurality of code blocks, each code block comprising a respective set of information bits and a respective set of parity bits encoded based on the respective set of information bits;
decoding each of the plurality of code blocks using the respective set of parity bits to recover the respective set of information bits;
upon failure to decode one of the code blocks, transmitting first feedback;
receiving a first outer code block comprising a set of outer code information bits and a set of outer code parity bits encoded based on the set of outer code information bits;
decoding the first outer code block using the set of outer code parity bits to recover the set of outer code information bits; and
recovering at least part of the respective set of information bits of the code block that failed to decode based on the outer code information bits and based on the respective set of information bits of at least one correctly decoded code block;
wherein one of the first outer code block and a code block of said plurality of code blocks has fewer information bits than another code block of said plurality of information bits.

15. The method of claim 14 wherein at least two of the code blocks have sets of information bits of differing sizes.

16. The method of claim 14 wherein at least one of the code blocks has a set of information bits larger in size than a set of outer code information bits of the first outer code block.

17. The method of claim 14 wherein the first outer code block is based on a combination of at least two padded sets of information bits, each padded set of information bits based on a corresponding set of information bits of a respective one of the plurality of code blocks;
wherein for each padded set of information bits:
when the corresponding set of information bits has a size equal to the first size, the padded set of information bits consists of the corresponding set of information bits; and
when the corresponding set of information bits has a size less than the first size, the padded set of information bits consists of the corresponding set of information bits padded with known bits to the first size.

18. The method of claim 14 wherein the first outer code block has a set of outer code information bits having a first size, and the outer code information bits are based on respective parts of the respective sets of information bits of at least two code blocks, and a set of outer code parity bits encoded based on the set of outer code information bits;
wherein recovering at least part of the respective set of information bits of the code block that failed to decode based on the outer code information bits and based on the respective set of information bits of at least one correctly decoded code block comprises:
recovering a first part of the respective set of information bits of the code block that failed to decode based on the respective set of outer code information bits of the at least one first outer code block and based on a respective corresponding part of the respective set of information bits of at least one correctly decoded code block;
the method further comprising recovering a remaining part of the respective set of information bits of the code block that failed to decode based on the recovered first part and the respective set of parity bits of the code block that failed to decode.

19. The method of claim 18 wherein one of the sets of information bits has the first size, and at least one of the sets of information bits is larger than the first size.

20. The method of claim 18 wherein one of the sets of information bits is larger than the first size by a first amount, and one of the sets of information bits is larger than the first size by a second amount different from the first amount.

21. The method of claim 14 wherein transmitting first feedback comprises transmitting HARQ feedback.

22. The method of claim 14 wherein transmitting first feedback comprises transmitting higher layer feedback indicating failure of a transport block containing the plurality of code blocks.

23. The method of claim 14 wherein:
transmitting first feedback comprises transmitting higher layer feedback indicating failure of a transport block containing the plurality of code blocks;
the first outer code block has a set of outer code information bits having a first size, and the outer code information bits are based on respective parts of the respective sets of information bits of two code blocks, and the outer code having a set of outer code parity bits encoded based on the outer code information bits;
the set of information bits of a first of the two code blocks has the first size, and the set of information bits of a second of the two code blocks is larger than the first size, the information bits of the second code block including a part of the first size and a remaining part;
wherein recovering at least part of the respective set of information bits of the code block that failed to decode based on the outer code information bits and based on the respective set of information bits of at least one correctly decoded code block comprises:
when the first code block failed to decode and the second code block succeeded to decode, recovering the information bits of the first code block based on the outer code information bits and the information bits of the second code block;
when the second code block failed to decode, transmitting second feedback;
receiving a second outer code block based on the remaining part of the second code block, and decoding the second outer code block; and
decoding part of the second code block of the first size based on the first outer code block and the information bits of the successfully decoded first code block, and decoding the remaining part based on the information bits of second outer code block.

24. The method of claim 23 wherein the second outer code block is based on the remaining part of the second code block and at least one bit of another code block.

25. An apparatus comprising:
an encoder configured to generate a plurality of code blocks, each code block comprising a respective set of information bits and a respective set of parity bits encoded based on the respective set of information bits;
a transmitter configured to transmit the plurality of code blocks;
a receiver configured to receive first feedback indicating failure to decode the plurality of code blocks;
the encoder further configured to, in response to the feedback, generate a first outer code block based on the plurality of code blocks; and
the transmitter further configured to transmit the first outer code block;
wherein one of the first outer code block and a code block of said plurality of code blocks has fewer information bits than another code block of said plurality of information bits.

26. An apparatus comprising:
a receiver configured to receive a plurality of code blocks, each code block comprising a respective set of information bits and a respective set of parity bits encoded based on the respective set of information bits;
a decoder configured to decode each of the plurality of code blocks using the respective set of parity bits to recover the respective set of information bits; and
a transmitter configured to, upon failure to decode one of the code blocks, transmit first feedback;
the receiver further configured to receive a first outer code block comprising a set of outer code information bits and a set of outer code parity bits encoded based on the set of outer code information bits;
the decoder further configured to:
decode the first outer code block using the set of outer code parity bits to recover the set of outer code information bits; and
recover at least part of the respective set of information bits of the code block that failed to decode based on the outer code information bits and based on the respective set of information bits of at least one correctly decoded code block;

wherein one of the first outer code block and a code block of said plurality of code blocks has fewer information bits than another code block of said plurality of information bits.

* * * * *